June 18, 1963 J. T. MAUPIN 3,094,673

PUSH-PULL SEMICONDUCTOR AMPLIFIER APPARATUS

Filed Dec. 10, 1959

INVENTOR.
JOSEPH T. MAUPIN
BY Osmund R. Dahle
ATTORNEY

United States Patent Office 3,094,673
Patented June 18, 1963

3,094,673

PUSH-PULL SEMICONDUCTOR AMPLIFIER APPARATUS

Joseph T. Maupin, Deephaven, Minn., assignor to Minneapolis-Honeywell Regulator Company, Minneapolis, Minn., a corporation of Delaware Filed Dec. 10, 1959, Ser. No. 858,733
3 Claims. (Cl. 330—15)

Figure 1:
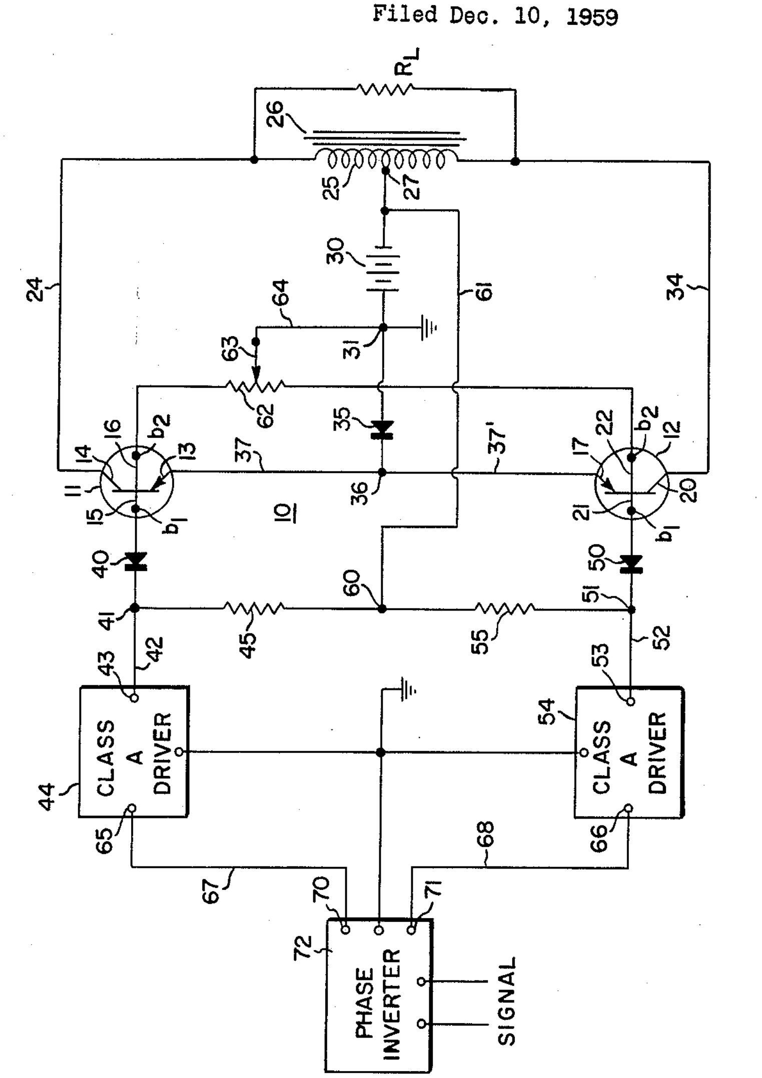

This invention relates to improvements in semi-conductor amplifier circuitry and is more specifically concerned with improvements in the field of class B push-pull power amplifier circuits including high efficiency, low distortion transistor amplifiers for use in audio output circuits.

Class B operation of power output stages is desirable because of high efficiency of operation and because of its low stand-by power consumption. The class B circuit is not without its own peculiar difficulties and disadvantages, however. One of the problems generally called crossover distortion is a result of a rough transition of output load current from one output transistor to the other. A second problem peculiar to class B transistor amplifiers is the discontinuity created by phase shift at the higher frequencies. Phase shift in a class A amplifier results only in a time delay between the input and output signals with no particularly objectionable results. In the class B transistor circuit, however, large amounts of phase shift at the higher frequencies create very undesirable transients at the crossover point. This invention is particularly concerned with circuit improvements to minimize or eliminate distortion of the latter type.

To consider further this problem in class B push-pull transistor power amplifiers, it will be appreciated that a finite time is required between the application of a signal which causes the emitter to inject carriers into the base region until the carriers are finally collected by the collector. If all the carriers reach the collector a substantially faithful reproduction of the signal can be obtained. Since the transit time for carriers from emitter to collector is substantially independent of the frequency it can be seen that as higher frequency signals are handled by the transistor, the phase lag between input and output is more pronounced. In fact, at the higher frequencies the signal is effective to reversely bias the emitter with respect to the base while some of the carriers are still in transit in the base region. A substantial portion of these carriers which have been injected into the base region from the emitter are recollected by the emitter during this period of reverse bias, with the result that one transistor is shut off before the other one of the push-pull pair is turned on, and thus crossover transients are produced which did not exist at the lower frequencies. In this invention a fast recovery or fast turn-off diode is placed in series with a base electrode of each transistor to prevent the signal from reverse biasing the emitter junction during the off half-cycle. In this manner the turn off waveform of the one transistor is matched with the turn on waveform of the other transistor.

It is an object of this invention therefore to provide an improved transistor class B push-pull power amplifier having a good frequency response in the audio range.

It is a further object of this invention to provide a transistor class B push-pull power amplifier having a diode in series with the control electrode to reduce the transient voltages created by phase shift at the higher frequencies of operation.

Figure 1A:
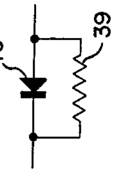

These and other objects of my invention will be apparent upon a consideration of the specification, claims and drawing of which:

FIGURE 1 is a schematic diagram of the circuit of one embodiment of my invention;

FIGURE 1*a* is a modification of a portion of FIGURE 1; and

Figure 2:
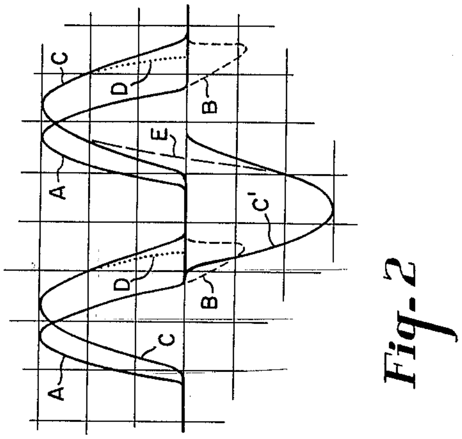

FIGURE 2 is a graphical representation of various applicable operating characteristics of transistor class B push-pull amplifiers.

Referring now to the drawing and particularly to FIGURE 1, there is disclosed a push-pull class B semiconductor power output stage 10 which includes a pair of semiconductor amplifying devices 11 and 12, here shown as PNP junction type tetrode transistors. The transistor 11 includes an emitter electrode 13, a collector electrode 14 and base or control electrodes 15($b_1$) and 16($b_2$), the transistor 12 having an emitter electrode 17, a collector electrode 20 and base or control electrodes 21($b_1$) and 22($b_2$). These power transistors may be in the form of the alloy junction transistors disclosed in my copending application, Serial No. 556,210, filed December 29, 1955, entitled "Semiconductor Devices," and assigned to the same assignee as the present invention. Although the semiconductor amplifying devices 11 and 12 preferably are in the form of tetrodes as disclosed, they may be triode devices. The transistor comprises a semiconductive body with the emitter 13 and collector 14 making rectifying junction contact thereto, and with the base electrodes making ohmic contact thereto.

The collector electrode 14 is connected by a conductor 24 to the upper terminal of a center tapped winding 25 of a choke coil 26 or output transformer. The circuit from the collector electrode is continued through the upper portion of the winding 25 to the center tap 27 and then to the negative terminal of a source of direct current potential 30, here shown as a battery, the positive terminal of which is connected to ground at a junction 31. The collector electrode 20 of transistor 12 is connected by a conductor 34 to the lower terminal of the winding 25, through the lower portion of the winding to the center tap 27 and then to the source 30. A current path can be traced to the emitter electrodes from the grounded junction 31 through a semiconductor rectifier 35, which is preferably a silicon diode, a junction 36 and a conductor 37 to the emitter 13. A conductor 37' also connects the junction 36 to the emitter 17 of transistor 12. A load device $R_L$, such as a suitable loudspeaker, may be connected across the winding 25 of the coil 26, or a portion thereof, to provide the proper impedance coupling. The load may also be transformer coupled, if desired.

The first base electrode $b_1$ of transistor 11 is connected through a rapid recovery or rapid turn-off junction diode 40, a junction 41, and a conductor 42 to the output terminal 43 of a driver stage 44. Likewise, the first base electrode $b_1$ of transistor 12 is connected by a rapid recovery junction diode 50, a junction 51 and a conductor 52 to an output terminal 53 of a driver stage 54. The driver stages 44 and 54 are preferably conventional class A type amplifiers operated in a push-pull relation. A pair of series connected base biasing resistors 45 and 55 having an intermediate junction 60 are connected between the junctions 41 and 51. The intermediate junction 60 of the two resistors is connected by a conductor 61 to the negative terminal of the source 30. The second base electrodes $b_2$ of transistors 11 and 12 are connected to opposite extremities of a potentiometer winding 62, which has an adjustable intermediate tap 63 connected by a conductor 64 to the positive terminal of source 30.

Input terminals 65 and 66 of driver stages 44 and 54, respectively, are connected by conductors 67 and 68 to output terminals 70 and 71 of a phase inverter 72. The phase inverter may be of any suitable type for providing push-pull output signals, such as a conventional split load type phase inverter. The audio signal to be amplified is connected to the input terminals of the phase inverter. Since the phase inverter and the driver stages form no part of the invention and are of a conventional nature they are indicated in block diagram form for simplicity of explanation.

In considering the operation of the over-all circuit, the signal is fed to the conventional split load phase inverter 72. The push-pull output signals of the phase inverter are fed, respectively, to the input terminals 65 and 66 of class A biased driver stages 44 and 54. The output circuits 43 and 53 of the driver stages are coupled to the class B biased output transistors.

It can be seen from a consideration of the circuit that the combination of bias to the bases $b_1$ and $b_2$ of each transistor, respectively, controls the quiescent collector current of the output transistors 11 and 12. In one successful operation of the circuit, for example, the bias was adjusted to provide a quiescent collector current in the output transistors 11 and 12 of 25 milliamperes per transistor. This is sufficient to bias the output transistors into a condition of slight conduction, however, it is still substantially a class B condition. Thus the combination of the forward bias on the base connections $b_1$ and a reverse bias on the base connections $b_2$, to be discussed further below, establishes the quiescent D.C. collector current operating point of the tetrodes.

The emitter electrodes of the output transistors 11 and 12 are maintained at a relatively constant negative voltage with respect to ground dependent upon the forward voltage characteristics of the biasing diode 35. Since the diode 35 always operates in the forward direction its only requirements are the ability to withstand the peak forward current of the output stage transistors and that it have a reasonably constant forward voltage drop over the operating current range. Silicon junction diodes may be used to provide this bias. The very low dynamic resistance of a power diode operating in this direction provides a nearly constant voltage and this relatively constant voltage drop is used to provide a reverse bias between the emitter and the base $b_2$ of each of the tetrodes. The reverse bias is applied through the potentiometer 62 to base electrodes 16 and 22. Adjustment of the wiper 63 of potentiometer 62 provides for equalization of the high current gain of the two output stages.

Previous investigation has shown that significant improvement in the linearity of the current transfer characteristic, i.e., signal current vs. collector current, of high power tetrode transistors can be realized by various methods of providing a transverse bias between base $b_2$ and base $b_1$ and by providing a reverse bias on the emitter base junction in the area of the emitter junction adjacent base connection $b_2$. An example is shown and described in detail in my copending application, Serial No. 699,827, entitled "Tetrode Transistor Amplifier," filed November 29, 1957, and assigned to the same assignee as the present invention.

In the class B transistor push-pull power amplifier an unusual type of distortion occurs, as has been mentioned above, which is not a problem in class A circuits or even in class B vacuum tube circuits. In push-pull class B circuits in general, each of the amplifying devices is conductive during alternate half-cycles. During the off half-cycle the signal potential is in the polarity direction to force hard cutoff of the amplifying device. In high power transistor circuits at high audio frequencies a new problem arises. Due to the transit time required for the carriers injected into the base region from the emitter to reach the collector electrode, a phase lag occurs between the signal applied to the base electrode and the amplified signal appearing in the collector circuit. This phase lag becomes increasingly significant as the signal frequency increases, since the transit time is relatively a constant. As the high frequency signal reverses from the half-cycle in which one of the transistors is made conductive, and in which carriers are being injected by the emitter into the base region, to the following half-cycle in which the instantaneous polarity reverses to cut off conduction in the transistor, the reversal in the signal provides a back bias on the emitter-base junction while carriers are still in transit in the base region. As a result of the reversal in polarity of the emitter junction due to the signal, a substantial portion of the carriers do not proceed to the collector but are recollected by the emitter. The trailing edge of the amplified wave of the collector circuit does not follow the signal therefore but is deprived of the portion of the carriers which returned to the emitter. In other words, the transistor collector current lags the signal in turning on, but is cut off abruptly by the action of the reversal of the signal. As a result the conductive output transistor cuts off before the other transistor is turned on and cross-over transients are introduced.

In this invention the signal is coupled from the driver stages to the base electrodes of the output transistors through diodes having a fast recovery time compared with the transistor, the turn-off time of the diode preferably being at least 10 times faster than the turn-off time of transistor. These diodes which are in series with base $b_1$ of the output tetrodes greatly reduce the transients created by phase shift at higher frequencies of operation. The addition of the diode prevents a reverse bias from developing across the emitter junction due to the signal since the diode has a rapid recovery time with respect to the tetrode, and therefore the reverse bias appears across the diode rather than across the emitter junction. FIGURE 1*a* is a modification of a portion of FIGURE 1 concerning the diodes 40 and 50. Under certain operating circumstances or with certain transistors it may be desirable to parallel the diodes 40 and 50 with a high value resistor 39. The sharpness of the turn off waveform can be modified or adjusted by the value of the resistor in parallel with the diode so that the turn off waveform of one transistor is matched with the turn on waveform of the other transistor thereby providing a smooth transition.

Reference is now made to FIGURE 2 in which the problem is shown graphically in the various curves. The curves are copied from photographs of the actual waveshapes as they appeared on an oscilloscope. The signal chosen to be amplified for the presentation in FIGURE 2 was a sine wave at a frequency of 10 kilocycles. Referring now to the curves in detail, curve A is a representation of the base current $Ib_1$ waveshape of transistor 11 with the diode 40 in the circuit. It can be seen that with the diode in series with the base of the transistor, the base current follows the signal during the forward half of the cycle, and is substantially zero during the reverse half-cycle, of the signal, as is desired. The fast recovery diode prevents the emitter junction from being reverse biased and the minority carriers proceed on to the collector electrode. The curve B, which extends below the reference line, is the negative base current waveshape extension of curve A which occurs when the invention is not used, i.e., when the diode 40 is omitted. The large negative portion is due to the carriers in the base region being recollected by the emitter. Curve C shows the transistor collector (output) current waveshape of transistor 11 when the diode is in the circuit. It can be seen that the collector current lags the signal current to some extent but is a substantially faithful reproduction. Curve D shows how the trailing edge of curve C is abruptly cut off and distorted when the diode is not in the circuit. The curve C′ shows the collector current waveform of transistor 12 which is conductive on the half-cycle when transistor 11 is cutoff. It can be seen that if the turn off waveform of transistor 11 matches and is substantially symmetrical with the turn on waveform of transistor 12, the output to the load which is the summation of the two currents during the crossover period is a smooth transition between transistor 11 and transistor 12 and vice versa. Curve E shows the effective resultant smooth transition waveform from summing the trailing edge of curve C' with the leading edge of curve C when the turn off, turn on waveforms are matched. It is equally apparent that a severe discontinuity results during the crossover interval when the diode is not used, since the sharp turn off represented by curve D does not match with the gradual turn on of the leading edge of curve C'.

In one successful embodiment of my invention the following components were used:

| | |
|---|---|
| Transistor **11, 12** | Honeywell tetrode H200E. |
| Diode **35** | 1N1085 or 1N1227. |
| Diode **40, 50** | HD2160. |
| Potentiometer **62** | 500 ohm. |
| Resistor **45, 55** | 180 ohm. |

In general, while I have shown a specific embodiment of my invention, it is to be understood that this is for the purposes of illustration and that my invention is to be limited solely by the scope of the appended claims.

I claim:

1. In transistor audio amplifier apparatus of the push-pull class B type which includes a pair of push-pull connected power transistors, each of said transistors having an emitter-base diode junction, in which the turn off waveform characteristic of the transistors does not match the turn on waveform due to a phase lag between the alternating signal being applied to the transistor input at the base and emitter electrodes and the amplified signal appearing at the collector circuit, which lag becomes significant at high audio frequencies so that the leading edge of the reverse polarity signal on the emitter junction during the off half-cycle of each transistor introduces unwanted distortion into the amplified signal, the improvement comprising: a pair of diodes, each diode having a rapid recovery time with respect to the transistor recovery time, said diodes being connected in series, respectively, with the base electrodes of said pair of transistors, said diodes being poled in the same direction as the emitter-base diode, the diode allowing forwerd current to flow in the transistor but due to the rapid recovery of the diode tending to prevent a reverse bias from appearing between the base and emitter electrodes upon reversal in polarity of the signal, and a relatively high resistance connected in parallel with each of said pair of diodes to provide a high resistance shunt around the diode and thereby allow a sufficient reverse current to flow to the emitter junction that the turn off characteristic of one transistor is matched to the turn on characteristic of the other so that said unwanted distortion is eliminated.

2. In transistor audio amplifier apparatus of the push-pull class B type which includes a pair of push-pull connected power transistors each having collector, emitter and base electrodes, each of said transistors having an emitter-base diode junction, the emitter and collector electrodes comprising output electrodes and the base and one of the emitter and collector electrodes comprising signal input electrodes, in which amplifier apparatus the turn-off waveform characteristic of the transistors does not match the turn-on waveform, which mismatch becomes increasingly significant at high audio frequencies so that the leading edge of the reverse polarity signal on the emitter junction during the off half-cycle of each transistor causes an abrupt turn off which introduces unwanted distortion into the amplified output signal, the improvement comprising: a pair of diodes having a rapid recovery time with respect to the transistors, one of said diodes being connected in series with the base electrode of each of said pair of transistors, said diodes being poled in the same direction as the transistor emitter-base diode to which it is connected, the diode allowing forward current to flow in the transistor but due to the rapid recovery of the diode tending to prevent a reverse bias from appearing between the base and emitter electrodes upon reversal in polarity of the signal, and a selected high resistance connected in parallel with each of said pair of diodes to provide a high resistance shunt around the diode and thereby allow a sufficient reverse current to flow to the emitter junction that the turn off characteristic of each transistor is matched to the turn on characteristic of the other whereby said distortion is eliminated.

3. In push-pull class B transistor amplifier apparatus for amplifying alternating current signals which includes push-pull transistor means, each transistor having a plurality of electrodes including emitter, collector and base electrodes, each of said transistors having an emitter-base diode junction, the alternating current signal being applied to the emitter and base electrodes in which the reverse polarity of the alternating signal on the base-emitter input junction of the transistor tends to disturb the normal transit of carriers from emitter to collector electrode whereby the turn-off waveform of the transistors does not match the turn-on waveform so that distortion is introduced into the reproduced output signal at said collector electrodes, an improvement for reducing said distortion comprising: a rapid recovery diode associated with each of said transistors, each of said diodes having a rapid recovery time with respect to the transistor, each of said diodes serially connecting the base electrode of its associated transistor to the signal, said diodes being poled in the same direction as the associated transistor emitter-base diode, the diode allowing forward current to flow in the transistor but due to the rapid recovery of the diode tending to prevent a reverse signal bias from appearing between the base and emitter electrodes upon reversal in polarity of the signal, and a relatively high resistance connected in parallel with the rapid recovery diode to provide a high resistance shunt around the diode and thereby allow a sufficient reverse current to flow to the emitter junction that the turn-off characteristic of one transistor is matched to the turn on charactristic of the other so that said unwanted distortion is eliminated.

References Cited in the file of this patent

UNITED STATES PATENTS

| | | |
|---|---|---|
| 2,849,626 | Klapp | Aug. 26, 1958 |
| 2,892,165 | Linsay | June 23, 1959 |
| 2,945,188 | Lancaster | July 12, 1960 |
| 2,963,655 | Schrock | Dec. 6, 1960 |

FOREIGN PATENTS

| | | |
|---|---|---|
| 766,744 | Great Britain | Jan. 23, 1957 |